United States Patent
McVey

(10) Patent No.: US 6,574,286 B2
(45) Date of Patent: *Jun. 3, 2003

(54) MODULATION SYSTEM HAVING ON-LINE IQ CALIBRATION

(75) Inventor: James D. McVey, Palo Alto, CA (US)

(73) Assignee: Alcatel Canada Inc., Ontario (CA)

(*) Notice: Subject to any disclaimer, the term of this patent is extended or adjusted under 35 U.S.C. 154(b) by 0 days.

This patent is subject to a terminal disclaimer.

(21) Appl. No.: 10/156,930

(22) Filed: May 29, 2002

(65) Prior Publication Data

US 2002/0191713 A1 Dec. 19, 2002

Related U.S. Application Data

(63) Continuation of application No. 09/573,607, filed on May 18, 2000, now Pat. No. 6,421,398, which is a continuation-in-part of application No. 09/493,733, filed on Jan. 28, 2000, now Pat. No. 6,421,397.

(51) Int. Cl.[7] .............................................. H04L 27/20
(52) U.S. Cl. ...................... 375/308; 332/103; 332/145
(58) Field of Search ................ 375/224, 279, 375/280, 281, 283, 308; 332/103, 144, 145; 330/149

(56) References Cited

U.S. PATENT DOCUMENTS

| | | | |
|---|---|---|---|
| 4,717,894 A | 1/1988 | Edwards et al. ............. 332/20 |
| 4,952,940 A * | 8/1990 | Kuepfer ....................... 342/174 |
| 5,119,399 A | 6/1992 | Santos et al. ................. 375/10 |
| 5,341,423 A | 8/1994 | Nossen ........................... 380/6 |
| 5,371,481 A | 12/1994 | Tiittanen et al. ............. 332/103 |
| 5,450,043 A | 9/1995 | Tanaka et al. ............... 332/103 |
| 5,512,865 A | 4/1996 | Fague ......................... 332/103 |
| 5,900,778 A | 5/1999 | Stonick et al. .............. 330/149 |
| 6,014,065 A | 1/2000 | Nishikawa .................... 332/103 |
| 6,058,291 A | 5/2000 | Ketcham ...................... 455/46 |
| 6,246,286 B1 | 6/2001 | Persson ....................... 330/149 |

* cited by examiner

Primary Examiner—Young T. Tse
(74) Attorney, Agent, or Firm—David R. Gildea

(57) ABSTRACT

A modulation system having in-phase and quadrature phase (IQ) calibration while on-line. The modulation system includes an on-line correction data state detector, an IQ correction code, and a scalar amplitude detector. The on-line correction state detector detects the presence of particular data states that are expected to result in particular modulation states or transition locations. When a particular data state is detected the IQ correction code compares the detected scalar magnitude with others that have been detected. The IQ correction code then uses the comparison to generate adjustments for I and Q offsets, I/Q phase, and I/Q gain. In a rotation embodiment, the modulation system further includes a rotation signal generator for generating rotation angles and an IQ rotator for applying the rotation angles for rotating the I and Q digital data streams.

24 Claims, 9 Drawing Sheets

| | I1 | I2 | I3 | I4 | I5 | I6 | Q1 | Q2 | Q3 | Q4 | Q5 | Q6 |
|---|---|---|---|---|---|---|---|---|---|---|---|---|
| MODULATION STATE (1,1) 56 | 1 | 1 | 1 | 1 | 1 | 1 | 1 | 1 | 1 | 1 | 1 | 1 |
| MODULATION STATE (1,0) 57 | 1 | 1 | 1 | 1 | 1 | 1 | 0 | 0 | 0 | 0 | 0 | 0 |
| MODULATION STATE (0,0) 58 | 0 | 0 | 0 | 0 | 0 | 0 | 0 | 0 | 0 | 0 | 0 | 0 |
| MODULATION STATE (0,1) 59 | 0 | 0 | 0 | 0 | 0 | 0 | 1 | 1 | 1 | 1 | 1 | 1 |
| TRANSITION LOCATION 62 | 1 | 1 | 1 | 1 | 1 | 1 | 0 | 0 | 0 | 1 | 1 | 1 |
| TRANSITION LOCATION 63 | 0 | 0 | 1 | 1 | 1 | 1 | 1 | 1 | 0 | 0 | 0 | 0 |
| TRANSITION LOCATION 64 | 0 | 0 | 0 | 0 | 0 | 0 | 0 | 0 | 0 | 1 | 1 | 1 |
| TRANSITION LOCATION 65 | 0 | 0 | 0 | 0 | 0 | 0 | 0 | 1 | 1 | 1 | 1 | 1 |
| TRANSITION LOCATION 66 | 1 | 0 | 0 | 0 | 1 | 1 | 1 | 1 | 1 | 1 | 0 | 0 |
| TRANSITION LOCATION 67 | 0 | 1 | 1 | 0 | 0 | 0 | 0 | 0 | 0 | 0 | 1 | 1 |
| TRANSITION LOCATION 68 | 1 | 1 | 0 | 0 | 0 | 0 | 1 | 1 | 1 | 1 | 1 | 0 |
| TRANSITION LOCATION 69 | 1 | 0 | 1 | 1 | 1 | 1 | 0 | 1 | 0 | 0 | 1 | 0 |

Fig. 5

MODULATION SYSTEM HAVING ON-LINE IQ CALIBRATION

CROSS REFERENCE TO RELATED APPLICATIONS

This application is a continuation of application Ser. No. 09/573,607 now U.S. Pat. No. 6,421,398 B1 filed May 18, 2000 which is a continuation in part of application Ser. No. 09/493,733 now U.S. Pat. No. 6,421,397 B1 filed Jan. 28, 2000 all by the same inventor.

BACKGROUND OF THE INVENTION

1. Field of the Invention

The invention relates generally to modulation systems and more particularly to an IQ modulation system using feedback for calibrating an IQ modulated output signal while the system is on-line.

2. Description of the Prior Art

In-phase (I) and quadrature phase (Q) modulators are commonly used for generating digital modulation such quadrature phase shift key (QPSK). QPSK is easily visualized in the IQ plane as an IQ diagram that is a square centered at the zero signal point and having modulation states at each of the corners. Many other common modulations, such as sixteen quadrature amplitude modulation (16QAM), 64 QAM, and 256 QAM, are possible using basically the same IQ modulator by controlling the amplitude of I and Q data streams driving the modulator. Unbalanced formats, where the I modulation amplitude and the Q modulation are not equal, are also possible using the same IQ modulator.

Such IQ modulators are subject to several well-known errors. One error is due to carrier signal that leaks through the IQ modulator into the modulated output signal. The carrier leakage offsets the IQ diagram of the signal away from the zero signal point and is therefore sometimes termed an offset error. In general, the offset error has both an I offset error in the I dimension of the IQ plane and a Q offset error in the Q dimension of the IQ plane. Another error, termed quadrature error or I/Q phase error, occurs because the I modulation and the Q modulation from the IQ modulator are not exactly in quadrature. Another error, termed I/Q gain imbalance, occurs because the I modulation component and the Q modulation component from the IQ modulator do not have a desired ratio. For standard QPSK, 16QAM, 64 QAM, and 256 QAM the desired ratio is one. However, unbalanced modulation formats having ratios other than one are possible.

Several approaches have been used for correcting the errors in IQ modulators. One approach is to observe the output of the IQ modulator on a vector network analyzer for certain test inputs while either adjusting parameters of the IQ modulator or adjusting the circuits driving the IQ modulator. Then, when the adjustments yield a satisfactory result, they are fixed in place and the IQ modulator is put into service. This approach has several disadvantages. Expensive test equipment is required. The parameters of the IQ modulator can drift causing the performance of the IQ modulator to degrade after the adjustments are fixed. And, the IQ modulator must be out of service while the calibration is performed. Another approach disclosed by Edwards et al. in U.S. Pat. No. 4,717,894 uses a scalar detector in place of the vector network analyzer. This approach eliminates the need for expensive test equipment. However, the Edwards approach also requires that the IQ modulator be out of service while it is being calibrated. It should be appreciated that a communication system cannot easily be taken off-line for calibration and adjustment.

There is a need for a modulation system that can be calibrated without taking the modulation system off-line.

SUMMARY OF THE INVENTION

It is therefore an object of the present invention to provide an apparatus and method using a scalar detector and feedback for on-line calibration of a modulation system.

Briefly, in a preferred embodiment, a modulation system of the present invention includes digital filters for converting in-phase (I) and quadrature phase (Q) data bit streams into filtered multilevel I and Q digital data streams, digital-to-analog converters for converting the data streams from digital to analog form, and an IQ modulator for converting the analog I and Q data streams into a modulated output signal that can be represented with an IQ diagram.

In order to reduce errors in the modulated output signal without talking the system off-line, the system also includes an on-line correction data state detector, an IQ correction code, and a scalar amplitude detector. Particular modulation states and transition locations of the IQ diagram are selected for consideration. The digital filters include forward shifting memories having several samples of the data bit streams for each data bit time. The data state detector monitors the samples in the memories, termed data states, and detects the presence of particular data states that are expected to provide the particular modulation states or transition locations. The amplitude detector monitors the modulated output signal and provides representative detected magnitudes. When one of the particular data states is detected the IQ correction code is triggered to receive the detected magnitude. The IQ correction code compares the detected magnitude to magnitudes that have been detected and stored previously and generates calibration adjustments from the comparisons for correcting errors in the modulated output signal.

In a transition location embodiment, the IQ correction code uses comparisons among detected scalar magnitudes corresponding to particular modulation states and particular transition locations for determining adjustment information.

In a rotation embodiment, the modulation system further includes a rotation signal generator for generating a rotation signal having changing rotation angles resulting in a rotation frequency and an IQ rotator for applying the rotation angles for rotating the I and Q digital data streams. The IQ correction code uses comparisons among detected scalar magnitudes corresponding to least one of the modulation states while the I and Q digital data streams are being rotated for determining adjustment information. The rotation may be used for tuning the frequency of the modulated output signal.

The primary errors requiring correction are carrier leakage, termed I and Q offsets; deviation from quadrature between I and Q modulation, termed I/Q phase error; and amplitude imbalance between I and Q modulation, termed I/Q gain error. Adjustment circuits having several alternative embodiments can be used for applying the corrective adjustments. In preferred embodiments, I and Q offsets are corrected with I and Q offset adjustment summers in the paths of the I and Q digital or analog data streams for adjusting the balance of I and Q mixers in the IQ modulator. The I/Q phase error is corrected with an I/Q phase adjustment multiplier and summer for the I and Q digital date streams or with a phase shifters in the IQ modulator. The I/Q gain error is corrected with a I/Q gain adjustment multiplier in one or more of the data streams or with a multiplying digital-to-analog converter in one or both of the data streams.

An advantage of a modulation system the present invention is that the modulation system uses an inexpensive scalar detector for calibrating the modulated output signal without interrupting service.

Another advantage of the rotation embodiment of the modulation system of the present invention is the frequency of the modulated output signal can be tuned by rotating the I and Q digital data streams, thereby enabling the use of a lower cost carrier signal generator for providing a precise frequency.

These and other objects and advantages of the present invention will no doubt become obvious to those of ordinary skill in the art after having read the following detailed description of the preferred embodiments which are illustrated in the various figures.

BRIEF DESCRIPTION OF THE DRAWINGS

FIG. 5 is a table of particular data states that are used for the on-line error calibration of the modulation system of FIG. 1;

DETAILED DESCRIPTION OF THE PREFERRED EMBODIMENTS

Figure 1:
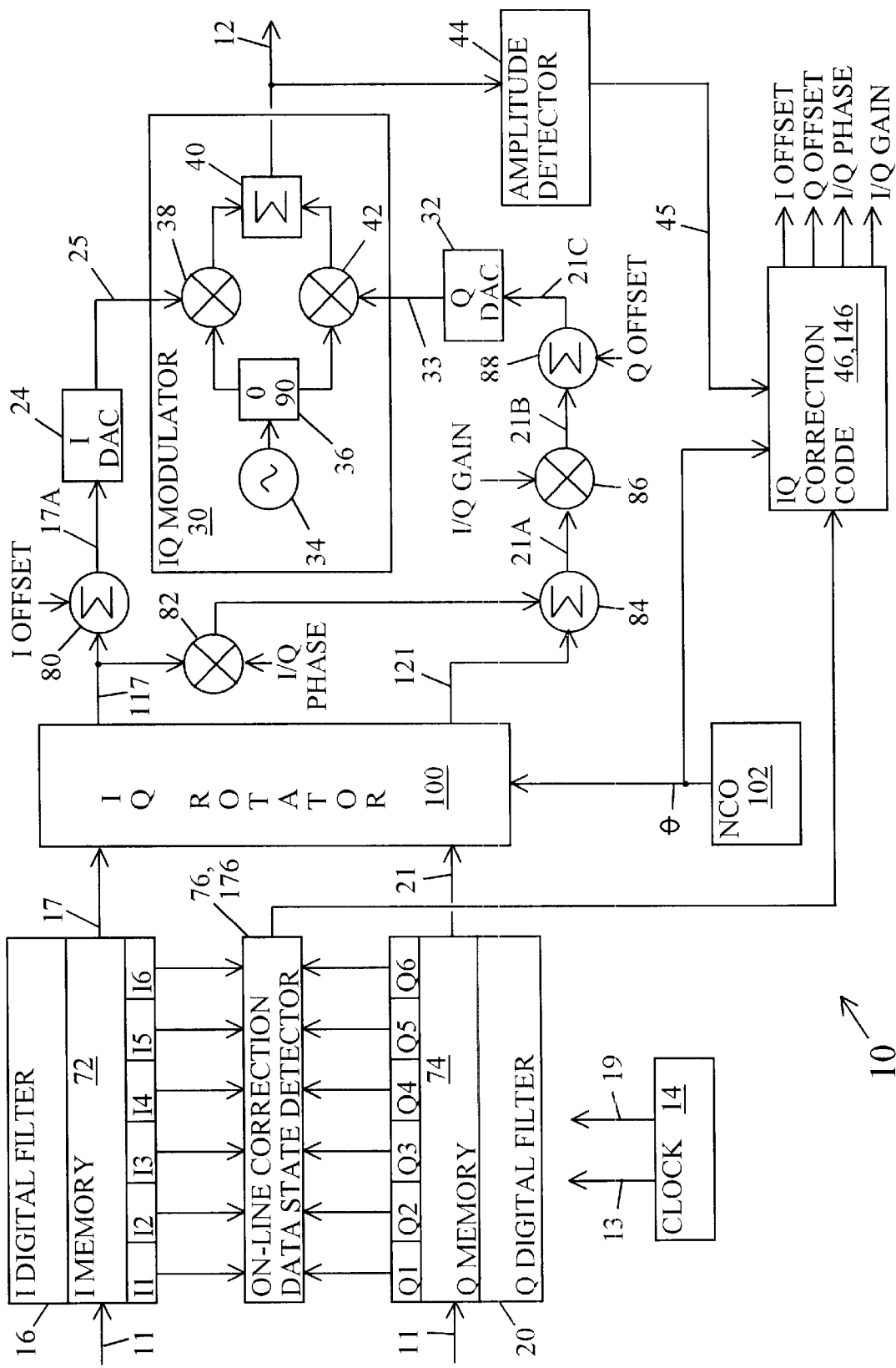
FIG. 1 is a block diagram of a modulation system of the present invention having on-line IQ error calibration.

FIG. 1 is a block diagram of a modulation system of the present invention referred to by the general reference number 10 for receiving data bits in a data stream input signal 11 and issuing a modulated output signal 12 having in-phase (I) and quadrature phase (Q) components. In a preferred embodiment, the input data bit stream 11 includes I and Q data bit streams carrying I and Q data bits, respectively. The I and Q data bit streams 11 are synchronized to a first clock signal 13 at a first clock rate from a clock 14. For a quadrature phase shift key (QPSK) modulation format, the I and Q data bit streams 11 each carry one bit of data for each cycle of the first clock signal. For higher order modulation formats, the I and Q data streams 11 carry correspondingly higher numbers of bits of data. For example, the I and Q data streams 11 each carry two bits of data for sixteen quadrature amplitude modulation (16QAM), three bits of data for sixty-four QAM, four bits of data for two-hundred fifty-six QAM, and so on, for each cycle of the first clock signal 13.

An I digital filter 16 filters the data bits in the I data bit stream 11 and issues a filtered multi-level I digital data stream 17 synchronized to a second clock signal 19 from the clock 14. The second clock signal 19 has a second clock rate of a multiple "N", for example four, times the first clock rate. Similarly, a Q digital filter 20 filters the data bits in the Q data bit stream 11 and issues a filtered multi-level Q digital data stream 21 synchronized to the second clock signal 19. Additional clock signals can be provided by the clock 14, for example, for operating the I and Q digital data streams 17,21 at different rates.

Figure 6:
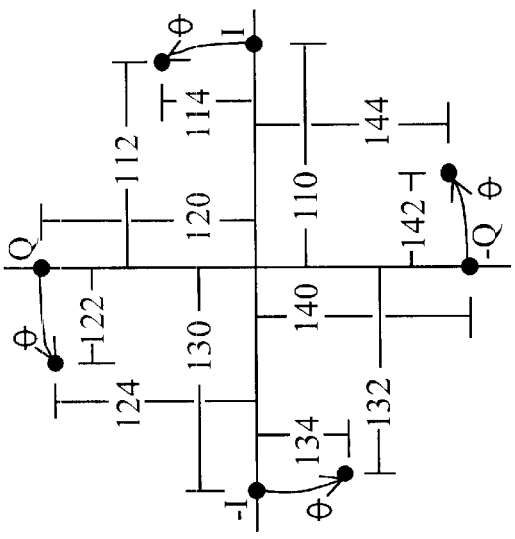
FIG. 6 is an IQ diagram of the modulated output signal showing a calibration rotation angle for 1 and Q digital data streams for a rotation embodiment of the modulation system of FIG. 1.
Figure 7:
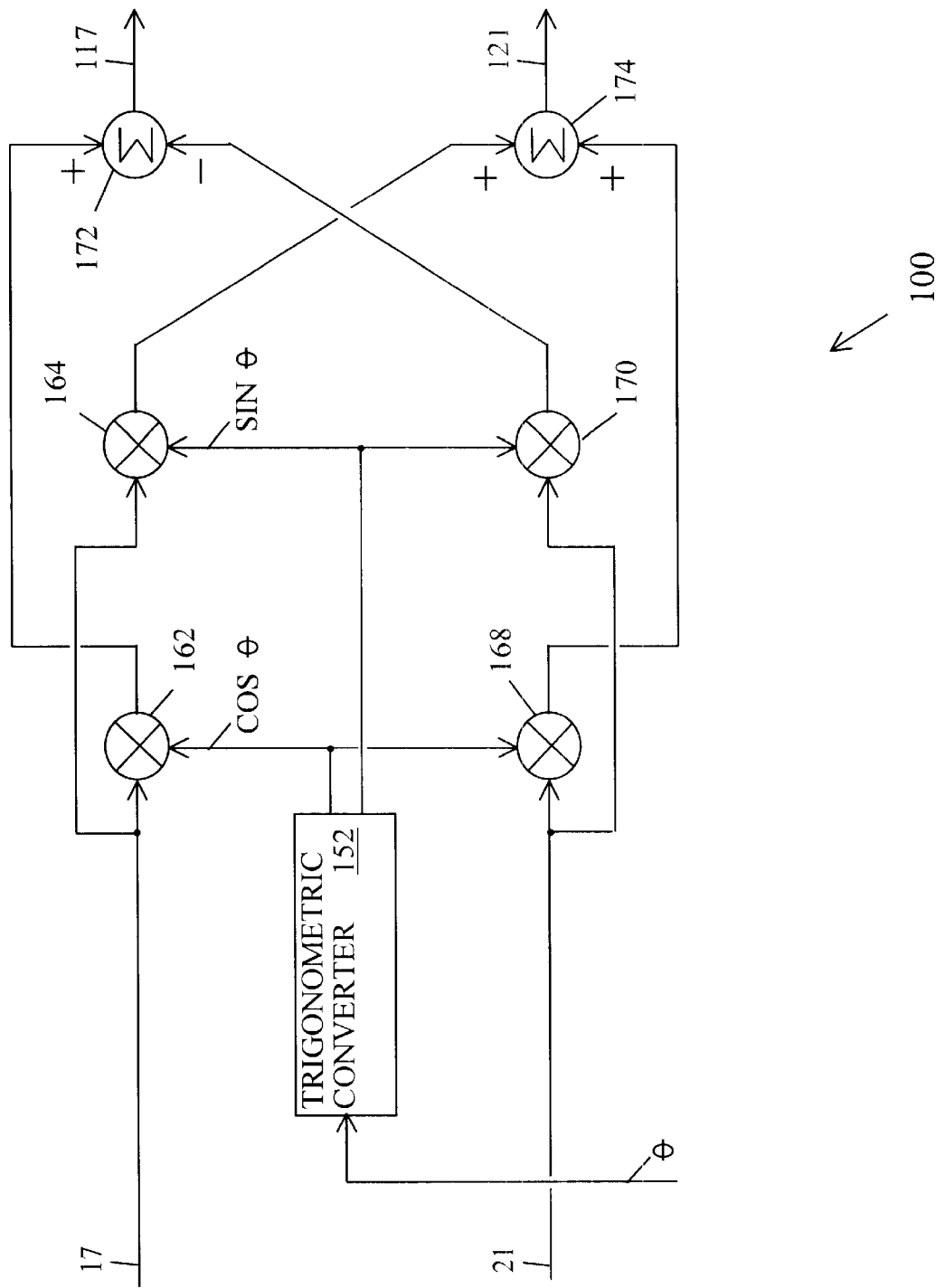
FIG. 7 is a block diagram of an IQ rotator of the rotation embodiment of the modulation system of FIG. 1.

Two embodiments of the modulation system 10 are described. In a first embodiment, termed herein a transition location embodiment, the I digital data stream 17 passes directly into an I digital data stream 117 and the Q digital data stream passes directly to a Q digital data stream 121. In a second embodiment, termed herein a rotation embodiment, the I and Q digital data streams 17,21 pass to an IQ rotator 100. In the rotation embodiment, a rotation signal generator implemented as a numerically controlled oscillator (NCO) 102 provides a calibration rotation angle θ in the range of 0 to 2π radians to the IQ rotator 100. Typically, NCO 102 issues an oscillating rotation signal where the rotation angle θ is continuously increasing or decreasing with modulo 2π, thereby setting a rotation frequency. However, the rotation angle θ from the NCO 102 can be fixed. The rotation angle θ drives the IQ rotator 100 to rotate the I and Q digital data streams to form the I digital data stream 117 and the Q digital data stream 121 as shown in FIGS. 6 and 7 and described in the accompanying detailed descriptions below.

The I digital data stream 117 passes to an I digital-to-analog converter (DAC) 24 where the signal is converted from a multi-level digital form to an analog form and issued as an analog I data signal 25 to an IQ modulator 30. Similarly, the Q digital data stream 121 passes to a Q digital-to-analog converter (DAC) 32 where the signal is converted from a multi-level digital form to an analog form and issued as an analog Q data signal 33 to the IQ modulator 30. The IQ modulator 30 uses the analog I and Q data signals 25,33 for providing the I and Q modulation components, respectively, for the modulated output signal 12.

The IQ modulator 30 includes an oscillator 34, a ninety degree splitter 36, an I mixer 38, a summer 40, and a Q mixer 42. The oscillator 34 generates a constant wavelength (CW) signal at the desired output frequency of the modulation system 10. The construction of such oscillator 34 using feedback and resonant circuitry is conventional. The CW signal is received by the ninety degree splitter 36 and split into an I CW signal and a Q CW signal where the Q CW signal is in quadrature with the I CW signal. The ninety degree phases splitter 36 can be constructed in a convention manner with quarter wave line lengths. Alternatively, the I and Q CW signals can be provided by an oscillator at four times the desired frequency and a divide-by-four divider for providing the I and Q CW signals in quadrature phase. The I CW signal is received by the I mixer 38. The I mixer 38 modulates the I CW signal with the analog I data signal 25 and issues an I modulated signal to a summer 40. Similarly, the Q CW signal is received by the Q mixer 42. The Q mixer 42 modulates the Q CW signal with the analog Q data signal 33 and issues a Q modulated signal to the summer 40. Such I mixer 38 and Q mixer 42 can be constructed conventionally with transformers and diodes. The summer 40 combines the I modulated signal and the Q modulated signal for providing the modulated output signal 12. Construction of such summer 40 using resistors and/or quarter wave lines is well-known.

An amplitude detector 44 tracks and detects the magnitude of the modulated output signal 12 while the modulation system 10 is on-line and passes information for the detected on-line magnitude 45 to an IQ correction code 46 for the transition location embodiment or an IQ correction code 146 for the IQ rotation embodiment. Such amplitude detector can be inexpensively constructed with a series diode and capacitor between the modulated output signal 12 and ground, and an analog-to-digital converter (ADC) having an input connected to the junction of the diode and capacitor and an output for issuing the detected magnitude 45 in a digital form. The capacitance of the capacitor is selected for being able to follow the frequency of the IQ modulation.

Figure 2:
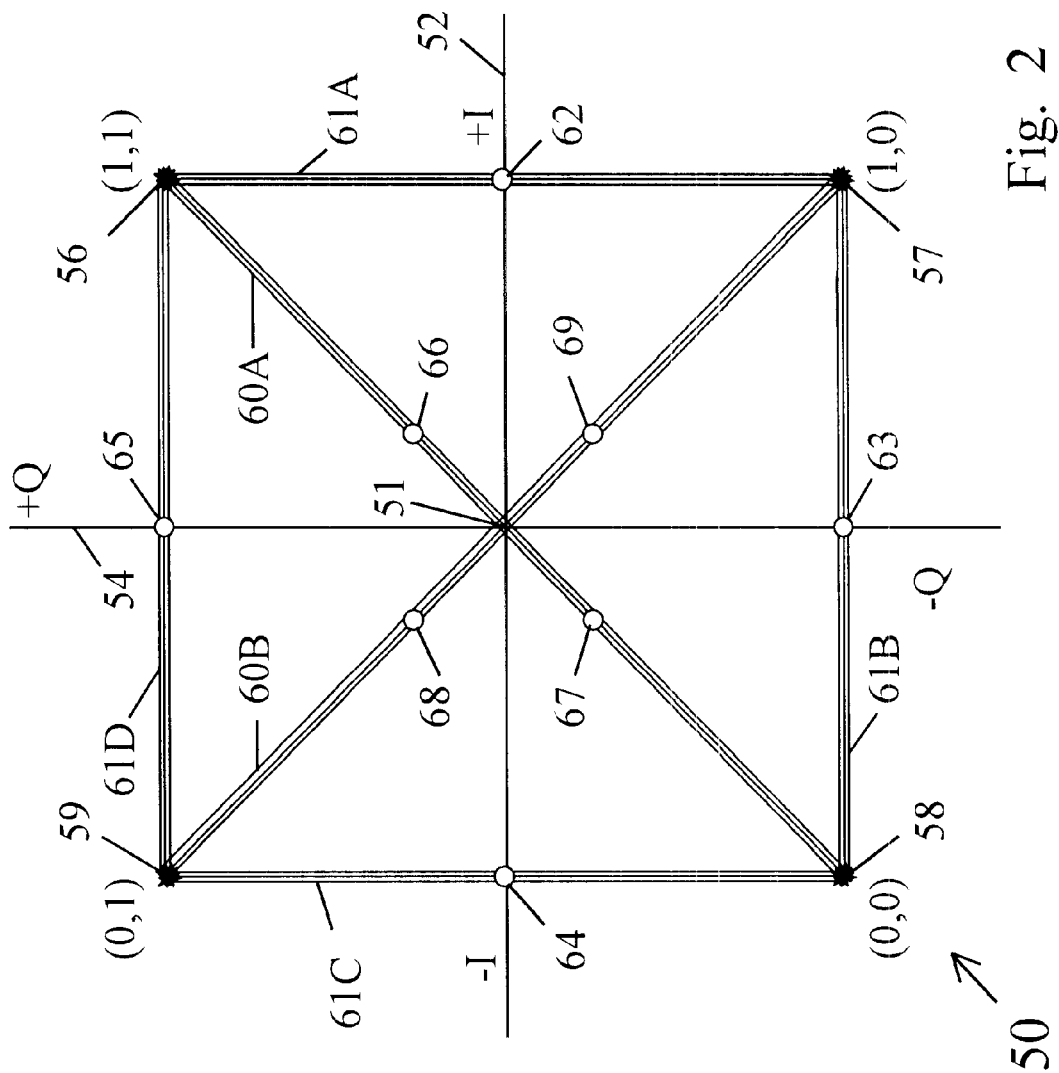
FIG. 2 is an IQ diagram of a modulated output signal issued by the modulation system of FIG. 1.

FIG. 2 illustrates an IQ diagram 50 of the modulated output signal 12. Such IQ diagram 50 is a visualization of the pattern that would be detected by a signal receiver having an IQ demodulator tuned to the frequency of the modulation output signal 12. The IQ diagram 50 includes a zero signal point 51, an I axis 52 and a Q axis 54. The I modulation component shows as positive or negative displacements in the dimension of the I axis 52. Similarly, the Q modulation component shows as positive or negative displacements in the dimension of the Q axis 54. The I and Q modulation components combine for making the modulated output signal 12. For an exemplary modulation of QPSK, (I,Q) modulation states for the modulated output signal 12 are state (1,1) 56, state (1,0) 57, state (0,0) 58, and state (0,1) 59. Transition paths 60A–B and 61A–D of the modulated output signal 12 between the states 56–59 are shown as closely spaced multiple lines to indicate that the path trajectories in a real system are subject to variations by effects such as intersymbol inference. Transition paths 60A–B are expected to pass through or near to the zero signal point 51 when both the I modulation component and the Q modulation component change. Transition paths 61A–D connect the IQ modulation states 56–59 when only one of the I and Q modulation components changes.

In the transition location embodiment, certain predetermined IQ locations along the transition paths 60A–B and 61A–D are selected for special consideration that will be described below. In a preferred embodiment, these IQ transition locations are as follows: Exterior transition location 62 on transition path 61A is mid way between state (1,1) 56 and state (1,0) 57. Exterior transition location 63 on transition path 61B is mid way between state (1,0) 57 and state (0,0) 58. Exterior transition location 64 on transition path 61C is mid way between state (0,0) 58 and state (0,1) 59. Exterior transition location 65 on transition path 61D is mid way between state (0,1) 59 and state (1,1) 56. Interior transition location 66 on transition path 60A is approximately two-thirds the way between state (0,0) 58 and state (1,1) 56. Interior transition location 67 on transition path 60A is approximately one-third the way between state (0,0) 58 and state (1,1) 56. Interior transition location 68 on transition path 60B is approximately two-thirds the way between state (1,0) 57 and state (0,1) 59. Interior transition location 69 on transition path 60B is approximately one-third the way between state (1,0) 57 and state (0,1) 59.

Continuing to use QPSK as the exemplary modulation format, ideally the IQ diagram 50 of the modulated output signal 12 is perfectly square and centered about the zero signal point 51. However, imperfections in the elements of the IQ modulator 30 cause the modulated output signal 12 to have several errors. The primary errors include CW carrier signal leakage, termed I and Q offsets; imbalance between the amplitudes of the I and Q modulation, termed to I/Q gain imbalance; and deviation from quadrature between the I modulation and the Q modulation, termed I/Q phase error. These errors typically are greater when the IQ modulator 30 operates at higher frequencies, for example microwave frequencies. The I and Q offsets cause the IQ diagram 50 to center about a point that is offset from the zero signal point 51 along the I axis 52 and the Q axis 54, respectively. The I and Q offsets can be positive or negative. The I/Q gain imbalance causes the IQ diagram 50 to be rectangular instead of square. The I/Q phase error causes the IQ diagram 50 to be a parallelogram. Isolators, attenuators, and/or amplifiers can be used in the signal paths between the various elements of the IQ modulator 30 to improve the matches between the elements in order to reduce second order errors.

Returning to FIG. 1, in order to compensate for the primary errors, the present invention applies corrective adjustments while the modulation system 10 is operationally on-line and providing the modulated output signal 12. The I digital filter 16 includes a forward shifting I memory 72 with a plurality of memory locations represented by I memory locations I1, I2, I3, I4, I5, and I6. The data bits from the I data stream input are received into the I memory 72 with the first clock signal 13 and then shifted through the I memory locations I1–I6 with the second clock signal 19. The filtered multi-level I digital data stream 17 is generated in the I digital filter 16 by multiplying the data bits from each of the I memory locations I1–I6 with respective pre-determined gains and then summing the products. Similarly, the Q digital filter 20 includes a forward shifting Q memory 74 with a plurality of memory location represented by Q memory locations Q1, Q2, Q3, Q4, Q5, and Q6. The data bits from the Q data stream input are received into the Q memory 74 with the first clock signal 13 and then shifted through the Q memory locations Q1–Q6 with the second clock signal 19. The filtered multi-level Q digital data stream 21 is generated by the Q digital filter 20 by multiplying the data bits from each of the Q memory locations Q1–Q6 with respective pre-determined gains and then summing the products. There can be more or less than six I memory locations I1–I6 in the I memory 72 and more or less than six Q memory location Q1–Q6 in the Q memory 74 depending upon the filtering that is required. A typical system 10 where clock signal 19 is at four times the rate of clock signal 13 might actually use twenty-four I memory locations and twenty-four Q memory locations.

The I memory locations I1–I6 and the Q memory locations Q1–Q6 represent a data state that is monitored by an on-line correction data state detector 76 in the transition location embodiment or an on-line correction data state detector 176 in the IQ rotation embodiment. The data state detector 76,176 detects when the data state matches predetermined particular data states.

In the transition location embodiment, the data state detector 76 detects the data states that correspond to particular (I,Q) modulation states 56–59 or transition locations 62–69 of the modulated output signal 12 represented in the IQ diagram 50 of FIG. 2. When a match is detected, the on-line-correction detector 76 issues a trigger signal having information indicative of the particular one of the (I,Q) modulation states 56–59 or transition locations 62–69 that is detected to the IQ correction code 46. Either the data state detector 76 delays the trigger signal or the IQ correction code 46 adds a time delay to match the time delay between data states in the I and Q memories 72 and 74, and the output of the detected magnitudes 45 from the amplitude detector 44. All the modulation states 56–59 have one expected magnitude. All the exterior transition locations 62–65 have a second expected magnitude. The interior transition locations 66–69 have a third expected magnitude. The expected magnitudes are stored and compared to the detected magnitudes 45 in order to detect and eliminate erroneous measurements.

In the rotation embodiment, the data state detector 176 detects the data states that correspond to one or more particular (I,Q) modulation states 56–59 in the IQ diagram 50 of FIG. 2. When a match is detected, the on-line-correction detector 176 issues a trigger signal having information indicative of the particular one of the (I,Q) modulation states 56–59 is detected to the IQ correction code 146. The IQ correction code 146 uses the trigger signal to receive the rotation angle θ that is applied by the IQ rotator 100 to the modulation state 56–59. Either the data state detector 176 delays the trigger signal or the IQ correction code 146 adds a time delay to match the time delay between data states in the I and Q memories 72 and 74, and the output of the detected magnitudes 45 from the amplitude detector 44. All the modulation states 56–59 have one expected magnitude. The expected magnitude is stored and compared to the detected magnitudes 45 in order to detect and eliminate erroneous measurements.

The modulation system 10 includes an I offset adjustment summer 80, an I/Q phase adjustment multiplier 82, and I/Q phase adjustment summer 84, an I/Q balance adjustment multiplier 86, and a Q offset adjustment summer 88. The I offset adjustment summer 80 sums the I offset adjustment with the multi-level I digital data stream 117 and then passes an adjusted multi-level I digital data stream 17A to the I DAC 24. The I/Q phase adjustment multiplier 82 multiplies the multi-level I digital data stream 117 times the I/Q phase adjustment and passes the product to the I/Q phase adjustment summer 84. The I/Q phase adjustment summer 84 sums the product with the multi-level Q digital data stream 121 and passes an adjusted multi-level Q digital data stream 21A to the I/Q gain adjustment multiplier 86. The I/Q gain adjustment multiplier 86 multiplies the adjusted multi-level Q digital data stream 21A by the I/Q gain adjustment and passes the product as a second adjusted multi-level Q digital data stream 21B to the Q offset adjustment summer 88. The Q offset adjustment summer 88 sums the Q offset adjustment with the second adjusted multi-level Q digital data stream 21B and passes a third adjusted multi-level Q digital data stream 21C to the Q DAC 32. Preferably, the I/Q gain adjustment multiplier 86 adjusts for I/Q gain imbalance by adjusting the amplitude of the Q modulation component to equal to the amplitude of the I modulation component. Alternatively, separate gain multipliers can be used for adjusting the levels of both the I and Q digital data streams 117 and 121 in order to adjust the output signal power of the modulated output signal 12 to a selected level. In another alternative, the modulation system 10 can be designed so that I modulation is greater than Q modulation or vice versa by properly selecting the gain factors in the I digital filter 16 with respect to the Q digital filter 20 or the I DAC 24 with respect to the Q DAC 32 for providing a rectangular, non-square IQ diagram 50. Such unbalanced modulation is commonly used, as for example the L1 signal of the global positioning system. It will be appreciated by those of ordinary skill in the art that the adjustments described above to the I digital data stream 117 can, instead, be made on the Q digital data stream 121, while the adjustments described above to the Q digital data stream 121 are made on the I digital data stream 117.

In a preferred embodiment the clock 14, the I digital filter 16, the Q digital filter 20, the data state detector 76,176, the IQ rotator 100, the NCO 102, the I offset adjustment summer 80, the I/Q phase adjustment multiplier 82, the I/Q phase adjustment summer 84, the I/Q gain adjustment multiplier 86, and the Q offset adjustment summer 88 are implemented in digital hardware. Preferably, the digital hardware is integrated. The IQ correction code 46 is stored in a memory that is coupled to a microprocessor. The microprocessor operates in a conventional manner for executing instructions in the IQ correction code 46 for computing and then issuing the I offset adjustment, the Q offset adjustment, the I/Q phase adjustment, and the I/Q gain adjustment as digital signals onto a signal bus that interconnects the digital hardware.

It is understood by those of ordinary skill in the communications field that in order to meet regulatory frequency accuracy requirements the oscillator 34 is a synthesized frequency source having one or more loops for upconverting the frequency of a reference frequency oscillator. At microwave frequencies and above the expense of such synthesized oscillator 34 increases rapidly when fine frequency resolution steps are required as for providing frequency channels. Preferably, in the rotation embodiment the rotation frequency generated by the NCO 102 is controlled by the microprocessor executing code in the memory offsetting the frequency of the synthesized oscillator 34 for providing the fine frequency resolution at a low cost.

Figure 3:
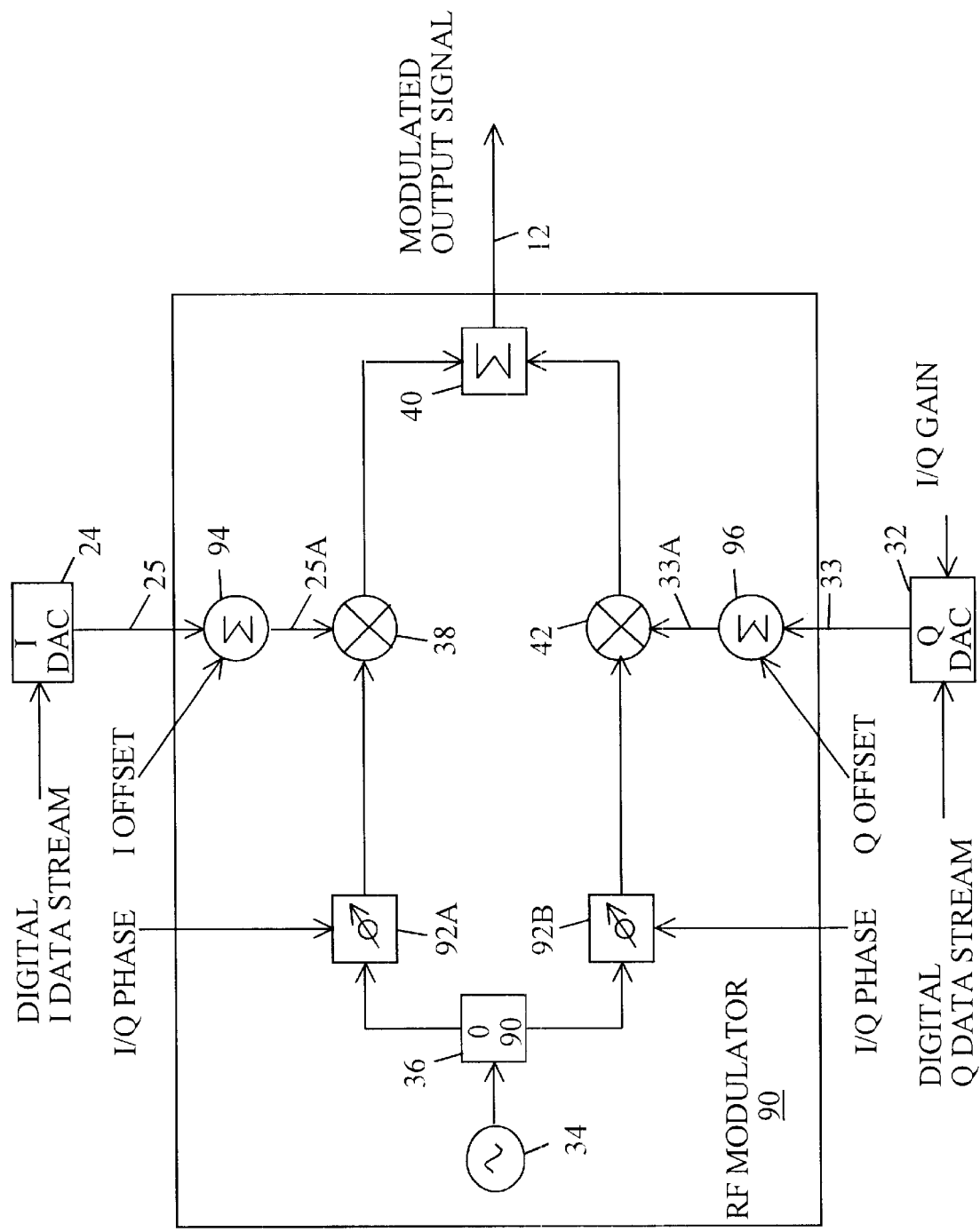
FIG. 3 is a block diagram of an alternative IQ modulator for the modulation system of FIG. 1.

FIG. 3 is a block diagram of an alternative IQ modulator 90 for the modulation system 10. The IQ modulator 90 includes the oscillator 34, the ninety degree splitter 36, the I mixer 38, the summer 40, and the Q mixer 42 as described above. The IQ modulator 90 also includes phase shifters 92A and 92B and bias summers 94 and 96. The oscillator 34 passes a CW signal to the ninety degree splitter 36. The ninety degree phase splitter 36 splits the CW signal into an I CW signal and a Q CW signal.

The phase shifters 92A and 92Q receive the I CW signal and the Q CW signal, respectively. The phase shifter 92A shifts the phase of the I CW signal according to the I/Q phase adjustment and passes the phase shifted I signal to the I mixer 38. Similarly, the phase shifter 92B shifts the phase of the Q CW signal according to the I/Q phase adjustment and passes the phase shifted Q signal to the Q mixer 42. Only one of the phase shifters 92A or 92B is required for adjusting for I/Q quadrature error. However, at higher frequencies, for example twelve gigahertz and above, it is preferable to use two phase shifters 92A and 92B for symmetry in order to reduce second order errors. For two phase shifters 92A and 92B, the I/Q phase adjustment includes A and B components so that as phase shifter 92A increases phase shift, the phase shifter 92B decreases shift phase and vice versa.

The bias summer 94 sums the I analog data 25 and a direct current (DC) signal for the I offset adjustment and passes adjusted I analog data 25A to the I mixer 38. Similarly, the bias summer 96 sums the Q analog data 33 and a direct current (DC) signal for the Q offset adjustment and passes the adjusted Q analog data 33A to the Q mixer 42. The I offset adjustment adjusts the balance of the I mixer 38 in order to reduce the I CW signal that leaks through the I mixer 38 to the summer 40. Similarly, the Q offset adjustment adjusts the balance of the Q mixer 42 in order to reduce the Q CW signal that leaks through the Q mixer 42 to the summer 40.

The I mixer 38 modulates the phase shifted I CW signal with the adjusted analog I data signal 25A and issues a phase shifted I modulation component signal to the summer 40. Preferably, the Q DAC 32 is a multiplying DAC having a controlled variable ratio between the level of the input filtered multi-level Q digital data stream and the level of the output analog Q data signal 33 according to the I/Q gain adjustment. Alternatively, both the Q DAC 32 and the I DAC 24 can be multiplying DACs to set the output power of the modulated output signal 12. The Q mixer 42 modulates the phase shifted Q CW signal with the adjusted analog Q data signal 33A and issues a phase shifted Q modulation component signal to the summer 40. The summer 40 combines the I modulation component and the Q modulation component for providing the modulated output signal 12. Digital-to-analog converters (DAC)s can be used to convert the digital levels for the I and Q offset adjustments, I/Q phase adjustment, and I/Q gain adjustment to analog levels for the bias summers 94 and 96, phase shifter 92A,B, and Q DAC 32.

It is to be understood that the adjustment elements for the modulation system 10 shown in FIG. 1 for the IQ modulator 30 and in FIG. 3 for the IQ modulator 90 can be mixed. For example, the modulation system 10 can use the I and Q offset adjustment summers 80 and 88 and I/Q gain multiplier 86 together with the phase shifters 92A and 92B, or the I and Q offset adjustment summers 80 and 88 and the I/Q phase adjustment multiplier and summer 82 and 84 together with the I/Q gain adjustment Q DAC 32, and so on.

Figure 4:
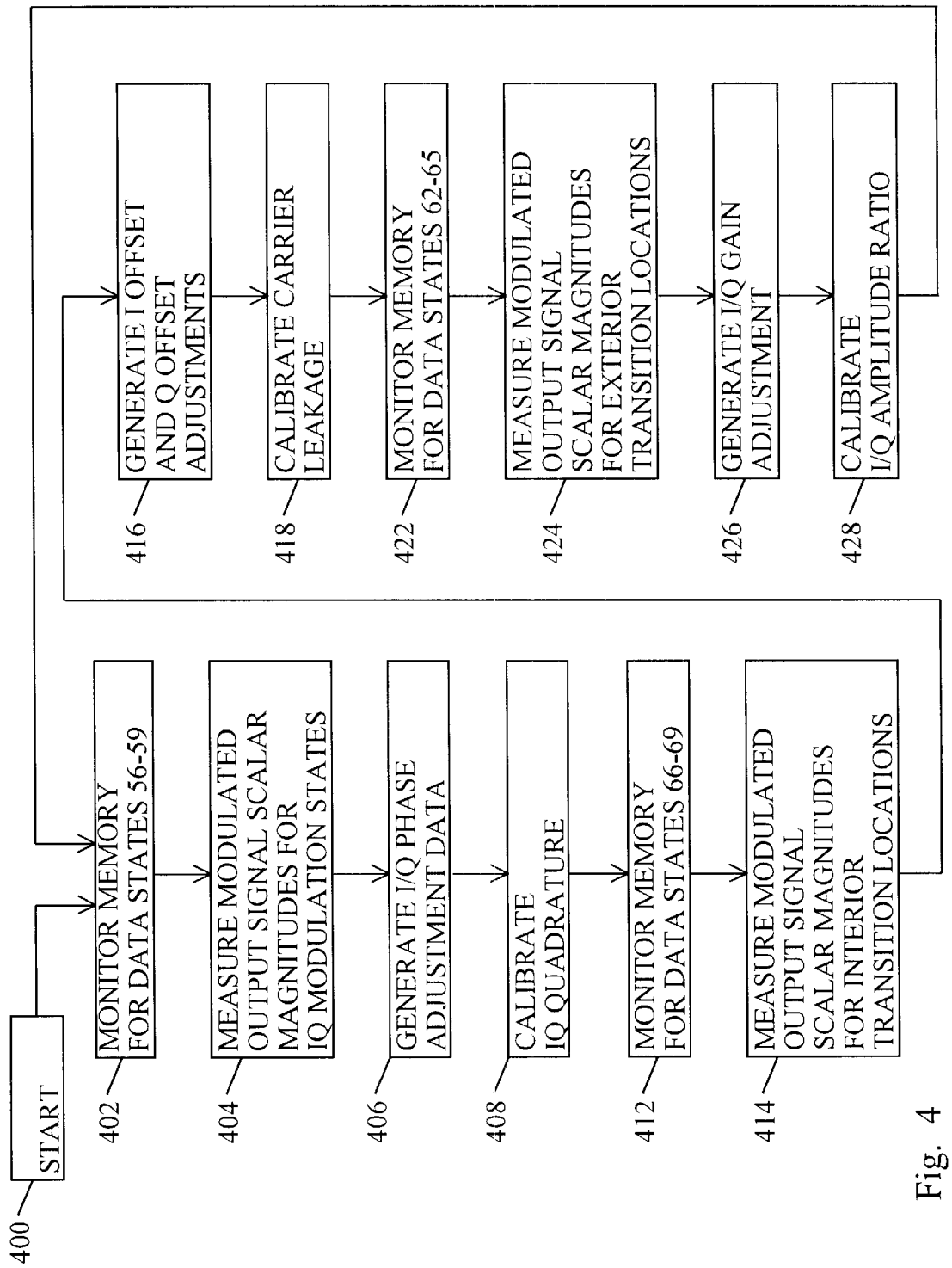
FIG. 4 is a flow chart of a calibration process for calibrating a transition location embodiment of the modulation system of FIG. 1.

FIG. 4 is a flow chart of an iterative calibration process in the transition location embodiment of the modulation system 10 for correcting for the primary errors in the IQ modulator 30 or the IQ modulator 90. Briefly, the IQ correction code 46 uses the actual detected magnitudes 45 corresponding to the modulation states 56–59 for generating the I/Q phase adjustment for correcting quadrature error, the magnitudes 45 corresponding to the interior transition locations 66–69 for generating the I and Q offset adjustments for correcting carrier leakage, and the magnitudes 45 corresponding to the exterior transition locations 62–65 for generating the I/Q gain adjustment for correcting I/Q imbalance.

At the start 400, the modulation system 10 is on-line issuing the modulated output signal 12. The amplitude detector 44 is monitoring the magnitude of the modulated output signal 12, and the on-line correction data state detector 76 is monitoring the data states in the I and Q memories 72 and 74. The IQ correction code 46 stores a first default level for the modulation states 56–59, a second default level for the exterior transition locations 62–65, and a third default level for the interior transition locations 66–69.

In a step 402, the data state detector 76 monitors the I and Q memories 72 and 74 for the data states corresponding to the IQ modulation states 56–59 and issues the trigger signal having information indicative of the particular one of the IQ modulation states 56–59 that is detected. In a step 404 the trigger signal is used to key the IQ correction code 46 to receive the magnitude 45. The step 404 is repeated until the magnitudes 45 have been received several times for each of the IQ modulation states 56–59 and the average of the magnitudes 45 for each of the respective modulation states 56–59 is computed. In a step 406 the I/Q correction code 46 generates the I/Q phase adjustment to equalize the sum of the average of the magnitudes 45 for the modulation state 56 and the average of the magnitudes 45 for the modulation state 58 to the sum of the average of the magnitudes 45 for the modulation state 57 and the average of the magnitudes 45 for the modulation state 59. Then, in a step 408 the I/Q phase adjustment data is used for calibrating I/Q phase (quadrature) error between the I modulation component and the Q modulation component.

In a step 412 the data state detector 76 monitors the I and Q memories 72 and 74 for the data states corresponding to the interior transition locations 66–69 and issues the trigger signal having information indicative of the particular one of the locations 66–69 that is detected. In a step 414 the trigger signal is used to key the IQ correction code 46 to receive the magnitude 45. The step 414 is repeated until the magnitudes 45 have been received several times for each of the interior transition locations 66–69 and the average of the magnitudes 45 for each of the respective locations 66–69 is computed. In a step 416 the I and Q offset adjustments are generated to equalize averages of the magnitudes 45 for the respective locations 66–69. Then, in a step 418 the I and Q offset adjustment data is used for calibrating for carrier leakage.

In a step 422 the data state detector 76 monitors the I and Q memories 72 and 74 for the data states corresponding to the exterior transition locations 62–65 and issues the trigger signal having information indicative of the particular one of the locations 62–65 that is detected. In a step 424 the trigger signal is used to key the IQ correction code 46 to receive the magnitude 45. The step 424 is repeated until the magnitudes 45 have been received several times for each of the exterior transition locations 62–65 and the average of the magnitudes 45 for each of the respective locations 62–65 is computed. In a step 426 the I/Q gain adjustment is generated to equalize the sum of the average of the magnitudes 45 for the modulation state 62 and the average of the magnitudes 45 for the modulation state 64 to the sum of the average of the magnitudes 45 for the modulation state 63 and the average of the magnitudes 45 for the modulation state 65. Then, in a step 428 the I/Q gain adjustment data is used for calibrating for the ratio of the amplitudes between the I modulation component and the Q modulation component.

The method then returns to the step 402 to repeat the steps 402–428 in a continuous manner. Further details of the iterative calibration process illustrated in FIG. 4 and described above are taught by Edwards et al. in U.S. Pat. No. 4,717,894 entitled "Calibration of Vector Modulator Using a Scalar Detector" incorporated herein by reference.

In an alternative non-iterative calibration process, the IQ correction code 46 stores a first default magnitude level for the modulation states 56–59 and a second default magnitude level for the exterior transition locations 62–65. The on-line correction state detector 76 monitors the I and Q memories 72 and 74 for the data states corresponding to the IQ modulation states 56–59 and the exterior transition locations 62–65. When one of these data states is detected, the data state detector 76 issues the trigger signal having information indicative of the particular one of the (I,Q) modulation states 56–59 or exterior transition locations 62–65 that is detected. The IQ correction code 46 uses the trigger signal as a key to read the detected magnitude 45 for the modulated output signal 12 and compute and store corresponding magnitude levels. A continuous average is maintained for each of the magnitude levels. The IQ correction code 46 then uses the averaged magnitude levels for computing overdetermined solutions for the I and Q offset adjustments and I/Q phase and gain adjustments. Details of the non-iterative calibration process described above are taught by Santos et al. in U.S. Pat. No. 5,119,366 entitled "Quadrature Measurement and Calibration of a Vector Modulator" incorporated herein by reference. Preferably, in the method described by Santos et al. the amplitude detector 44 (FIG. 1) includes an analog-to-digital converter (ADC) constructed to compensate for the characteristics of a detector diode so that the output of the ADC is linearly proportional to the magnitude of the modulated output signal 12.

FIG. 5 is a table of the particular data states that are used by the on-line correction data state detector 76 for triggering the IQ correction code 46, and the corresponding modulation states 56–59 and transition locations 62–69. For example, the modulation state (1,1) 56 corresponds to the data state 1,1,1,1,1,1,1,1,1,1,1,1. Each of the transition locations 62–69 corresponds to two associated data states I1–6, Q1–6 because the locations 62–69 can be traversed from either of two directions. For example, the transition location 62 is corresponds to the data state 1,1,1,1,1,1,0,0,0,1,1,1 for the transition path 61A in the direction from modulation state (1,1) 56 to modulation state (1,0) 57 and to the data state 1,1,1,1,1,1,1,1,0,0,0 for the transition path 61A in the direction from modulation state (1,0) 57 to modulation state (1,1) 56.

FIG. 6 is an IQ diagram showing the effect of the rotation of the I and Q digital data streams 17,21 by the calibration rotation angle θ in the rotation embodiment of the modulation system 10 using the IQ rotator 100 (FIG. 1). The I digital data stream 17 (FIG. 1) varies in amplitude along the I,-I axis and the Q digital data stream 21 (FIG. 1) varies in amplitude along the Q,-Q axis. The IQ rotator 100 receives the I and Q digital data streams 17,21 and issues the rotated I digital data stream 117 (FIG. 1) and rotated Q digital data stream 121 (FIG. 1) as shown in equations 1 and 2 below:

$$I_{out} = I_{in} \times \cos(\theta) - Q_{in} \times \sin(\theta) \quad (1)$$

$$Q_{out} = I_{in} \times \sin(\theta) + Q_{in} \times \cos(\theta) \quad (2)$$

The equation 1 shows that the rotated I digital data stream 117, $I_{out}$, equals the input I digital date stream 17, $I_{in}$, times the cosine of the rotation angle θ minus the input Q digital data stream 21, $Q_{in}$, times the sine of the rotation angle θ. The equation 2 shows that the rotated Q digital data stream 121, $Q_{out}$, equals the input I digital date stream 17, $I_{in}$, times the sine of the rotation angle θ plus the input Q digital date stream 21, $I_{in}$, times the cosine of the rotation angle θ. Accordingly, the IQ rotator 100 (FIG. 1) rotates an I value 110 of the I digital data stream 17 to provide an I value 112 for the rotated I digital data stream 117 and a Q value 114 for the Q digital data stream 121; rotates a Q value 120 for the Q digital data stream 21 to provide an I value 122 for the rotated I digital data stream 117 and a Q value 124 for the rotated Q digital data stream 121; rotates an I value 130 of the I digital data stream 17 to provide an I value 132 for the rotated I digital data stream 117 and a Q value 134 for the Q digital data stream 121; and rotates a Q value 140 for the Q digital data stream 21 to provide an I value 142 for the rotated I digital data stream 117 and a Q value 144 for the rotated Q digital data stream 121.

FIG. 7 is a block diagram of the IQ rotator 100 for the rotation embodiment of the present invention. The IQ rotator 100 includes a trigonometric converter 152 for converting the rotation angle θ to sine θ and cosine θ. Such trigonometric converter 152 can be constructed with a table lookup device. The IQ rotator 100 also includes multipliers 162, 164, 168, and 170 and summers 172 and 174. The multiplier 162 multiplies the I digital data stream 17 times the cosine θ and issues the product to a positive input of the summer 172. The multiplier 164 multiplies the I digital data stream 17 times the sine θ and issues the product to a positive input of the summer 174. The multiplier 168 multiplies the Q digital data stream 21 times the cosine θ and issues the product to a positive input of the summer 174. The multiplier 170 multiplies the Q digital data stream 21 times the sine θ and issues the product to a negative input of the summer 172. The summer 172 issues the rotated I digital data stream 117 and the summer 174 issues the rotated Q digital data stream 121.

FIGS. 8A–D illustrate IQ diagrams showing IQ paths 200–203, respectively, for any one of the modulation states: state (1,1) 56, state (1,0) 57, state (0,0) 58, and state (0,1) 59 against a background of an axis I,-I and an axis Q,-Q. The IQ paths 200–203 show the modulation state 56–59 as the modulation state 56–59 would be detected by a complex IQ detector when the modulation states 56–59 are continuously rotating through the calibration rotation angle θ that is increasing or decreasing due to a difference between the frequency of the modulation output signal 12 and the frequency of the IQ detector. As described below in the description accompanying FIG. 11, the rotation angle phase θ is adjusted by the phase of the modulation states 56–59 to provide an adjusted calibration rotation angle Φ. All of the modulation states 56–59 can then be superimposed on the same one of the IQ paths 200–203. The IQ paths 200–203 are shown as clean lines in the FIGS. 8A–D, respectively, in order to more easily understand to concept of the IQ calibration of the modulation system 10. Of course, in an actual system, the detected IQ paths 200–203 would be thicker due to intersymbol interference, crosstalk, and other types of noise.

Figures 8A, 8B, 8C, 8D:
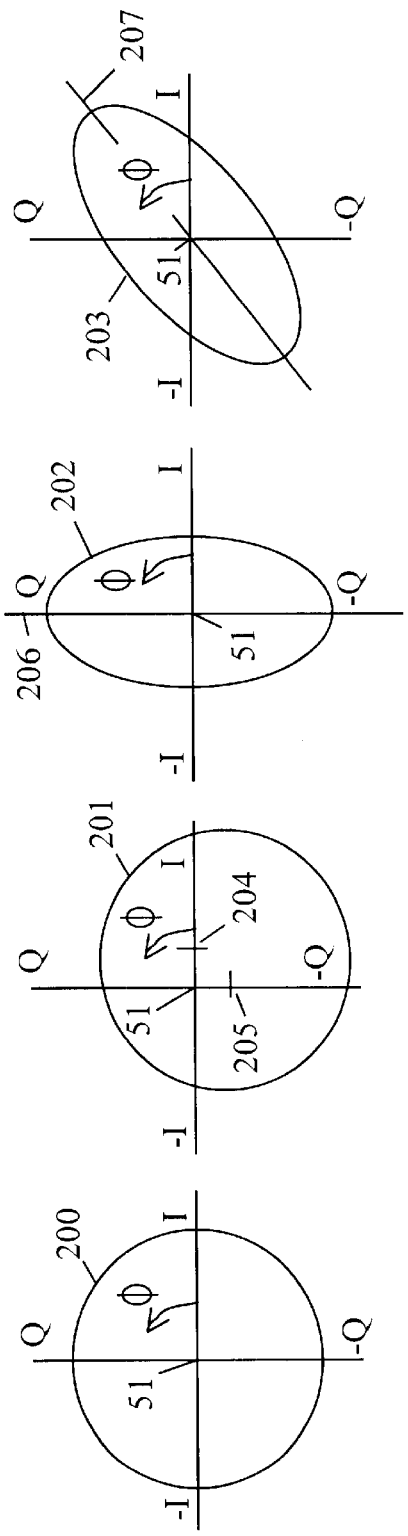
FIGS. 8A, 8B, 8C, and 8D are IQ diagrams for the modulated output signal with respect to the calibration rotation angle of FIG. 6 showing the correct calibration of the signal, the signal with I and Q offset errors, the signal with I/Q gain imbalance, and the signal with I/Q phase error, respectively, for the rotation embodiment of the modulation system of FIG. 1.

FIG. 8A shows the IQ path 200 of each of the modulation states 56–59 as a circle centered about the zero signal point 51 illustrating the correct IQ calibration for the modulation system 10. The circular IQ path 200 centered at the zero signal point 51 indicates that the modulation system 10 has no I or Q offset error, no I/Q gain imbalance, and no I/Q phase error. FIG. 8B shows the IQ path 201 of each of the modulation states 56–59 as a circle having an offset from the zero signal point 51 illustrating a modulated output signal 12 that has both I and Q offset errors. The IQ path 201 shows an I offset 204 along the axis I,-I and a Q offset 205 along the axis Q,-Q. The circular IQ path 201 not centered at the zero signal point 51 indicates I and Q offset errors but no I/Q gain imbalance or I/Q phase error. FIG. 8C shows the IQ path 202 of each of the modulation states 56–59 as an ellipse having a center on the zero signal point 51 and a major axis 206 on the axis Q,-Q showing I/Q gain imbalance where Q is greater than I. For I greater than Q the major axis 206 of the elliptical IQ path 202 would be on the axis I,-I. The elliptical IQ path 202 indicates I/Q gain imbalance but no I or Q offset error and no I/Q phase error. FIG. 8D shows the IQ path 203 of each of the modulation states 56–59 as an ellipse having a center on the zero signal point 51 and a major axis 207 at a 45° angle (or a 135°) from the axis I,-I and the axis Q,-Q showing I/Q phase error. The major axis could also have a 135° angle. The elliptical IQ path 203 indicates I/Q phase error but no I and Q offset errors and no I/Q gain imbalance. An actual IQ path for an uncalibrated modulation system 10 would show an combination of the IQ paths 201, 202, and 203.

Figure 9:
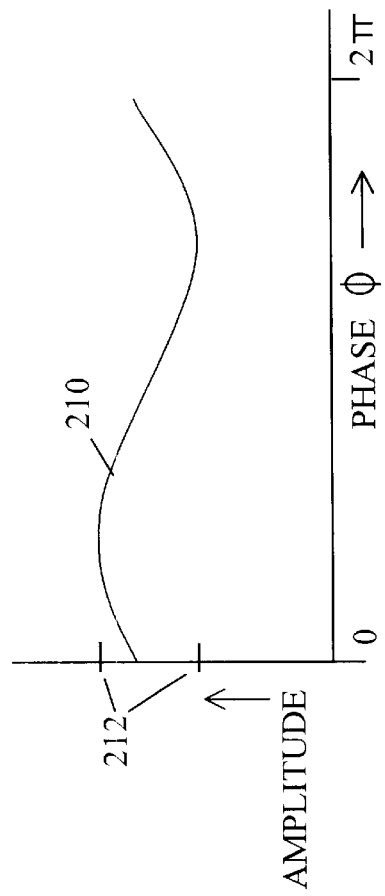
FIG. 9 is a diagram of scalar amplitude with respect to calibration rotation angle of the modulated output signal for the rotation embodiment of the modulation system of FIG. 1.

FIG. 9 is a diagram showing a function 210 for the detected magnitude 45 versus the rotation angle θ as described in FIGS. 8A–D above. The function 210 represents the scalar amplitude of the modulated output signal 12 between the zero signal point 51 and the actual IQ path such as the IQ paths 200–203. The function 210 has a magnitude variation 212.

Figure 10:
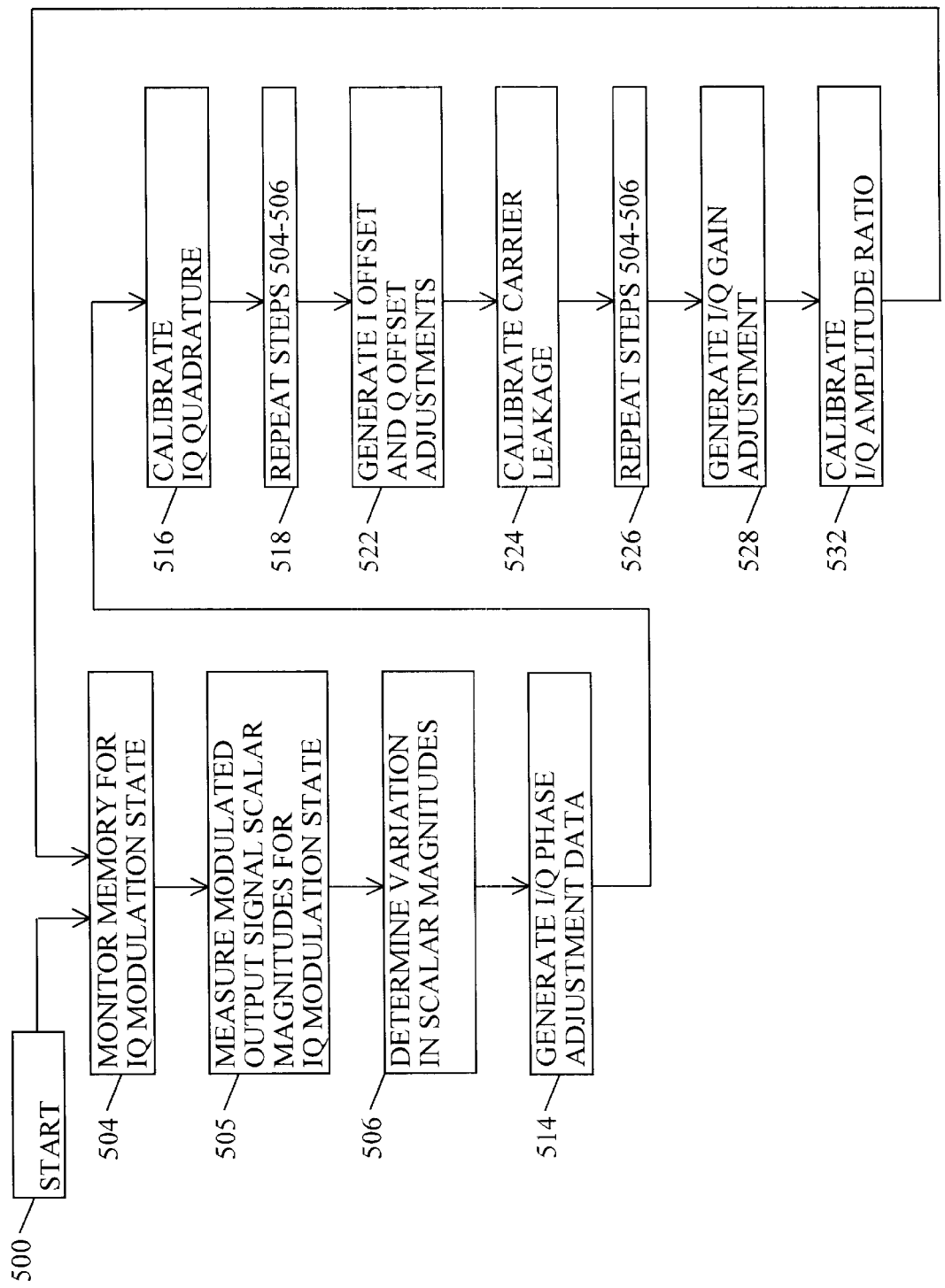
FIG. 10 is a flow chart of an iterative calibration process for the rotation embodiment of the modulation system of FIG. 1.

FIG. 10 is a flow chart of an iterative calibration process in the rotation embodiment of the modulation system 10 for correcting for the primary errors in an IQ modulator such as the IQ modulator 30 or the IQ modulator 90. Briefly, the IQ correction code 146 sequentially generates the I/Q phase adjustment for correcting quadrature error, generates the I and Q offset adjustments for correcting carrier leakage, and generates the I/Q gain adjustment for correcting I/Q imbalance for minimizing the variation 212 for at least one of the modulation states 56–59 as the calibration rotation angle θ is changed.

At the start 500, the modulation system 10 is on-line issuing the modulated output signal 12. The amplitude detector 44 is monitoring the magnitude of the modulated output signal 12, and the on-line correction data state detector 176 is monitoring the data states in the I and Q memories 72 and 74. The IQ correction code 146 stores a default level for the modulation states 56–59.

In a step 504, the data state detector 176 monitors the I and Q memories 72 and 74 for the data state corresponding to at least one of the IQ modulation states 56–59, preferably for all four IQ modulation states 56–59, and issues the trigger signal having information indicative of the particular one of the IQ modulation states 56–59 that is detected. For 16, 64, or 256 QAM the data state detector 176 monitors the I and Q memories 72 and 74 for the data states corresponding to the outside corners of the IQ pattern or some other set of IQ modulation states that have a particular relative expected scalar magnitude. In a step 505 the trigger signal is used to key the IQ correction code 146 to receive the magnitude 45. The step 505 may be repeated until the magnitudes 45 have been received for each of the IQ modulation states 56–59 that are being used and then averaged. In a step 506 the IQ correction code 146 computes the variation 212. The magnitude variation 212 may be detected in terms of a root mean square deviation from the mean.

In a step 514 the I/Q correction code 146 generates the I/Q phase adjustment to reduce the variation 212. In a step 516 the I/Q phase adjustment data is used for calibrating I/Q phase (quadrature) error between the I modulation component and the Q modulation component.

In a step 518 the steps 504 to 506 are repeated. In a step 522 the IQ correction code 146 generates the I and Q offset adjustments to reduce the variation 212. In a step 524 the I and Q offset adjustment data is used for calibrating for carrier leakage.

In a step 526 the steps 504 to 506 are repeated. In a step 528 the IQ correction code 146 generates the I/Q gain adjustment to reduce the variation 212. In a step 532 the IQ gain adjustment data is used for calibrating for the ratio of the amplitudes between the I modulation component and the Q modulation component. Then, returning to the step 504, the iterative calibration process is repeated a continuous loop in order to minimize the variation 212 and maintain the variation 212 at a minimum value. Further details of this method are described by Edwards et al. in U.S. Pat. No. 4,717,894.

Figure 11:
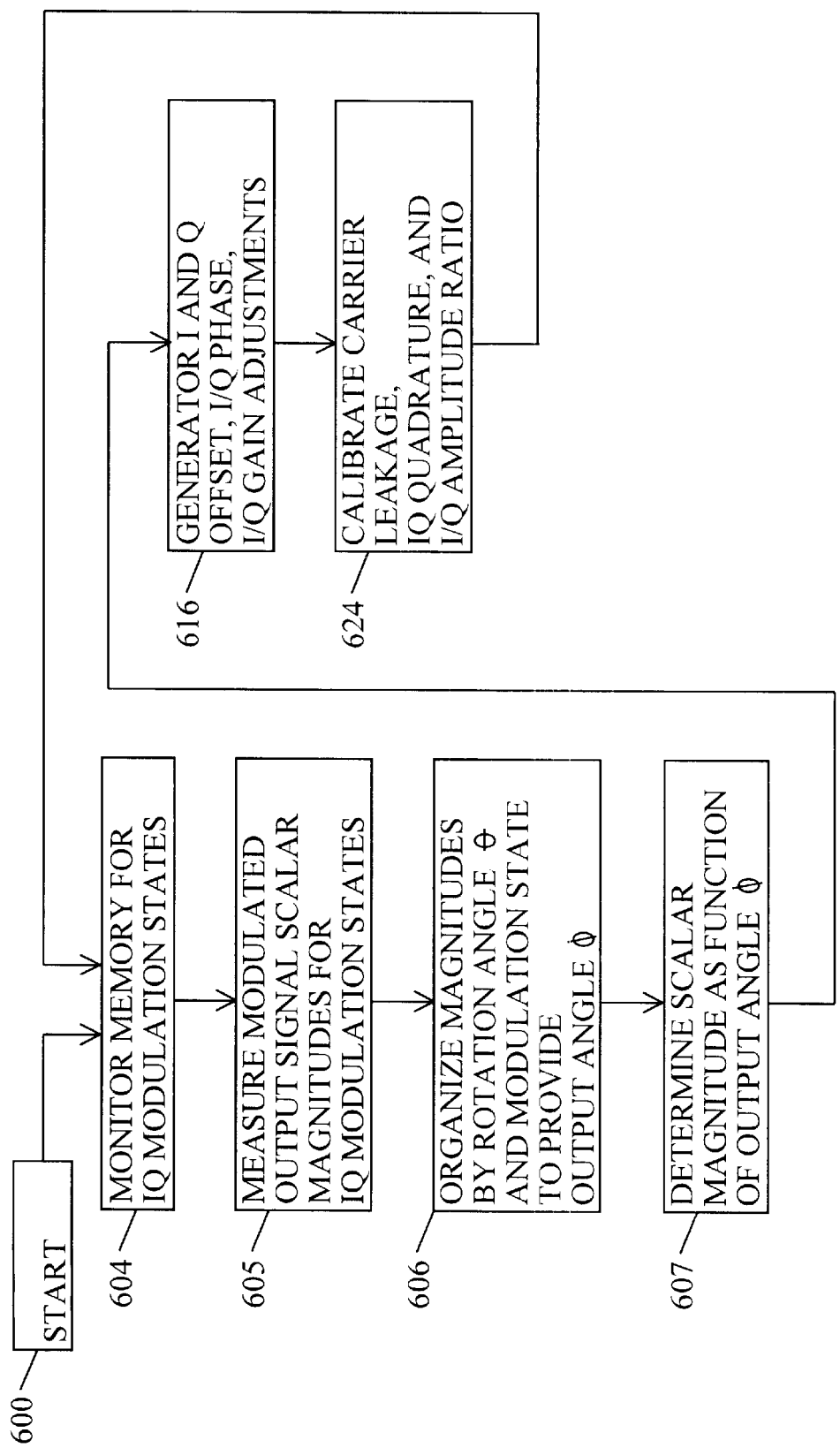
FIG. 11 is a flow chart of a curve fit calibration process for the rotation embodiment of the modulation system of FIG. 1.

FIG. 11 is a flow chart illustrating a curve fit calibration process in the rotation embodiment of the modulation system 10 for correcting for the primary errors in the IQ modulator 30 or the IQ modulator 90. Briefly, the IQ correction code 146 uses the actual detected magnitudes 45 corresponding to at least one of the modulation states 56–59 and the rotation angle θ for generating the I/Q phase adjustment for correcting quadrature error, generating the I and Q offset adjustments for correcting carrier leakage, and generating the I/Q gain adjustment for correcting I/Q imbalance.

At the start 600, the modulation system 10 is on-line issuing the modulated output signal 12. The amplitude detector 44 is monitoring the magnitude of the modulated output signal 12, and the on-line correction data state detector 176 is monitoring the data states in the I and Q memories 72 and 74. The IQ correction code 146 stores a default level for at least one of the modulation states 56–59.

In a step 604, the data state detector 176 monitors the I and Q memories 72 and 74 for the data states corresponding to at least one of the IQ modulation states 56–59, preferably for all four IQ modulation states 56–59, and issues the trigger signal having information indicative of the particular one of the IQ modulation states 56–59 that is detected. For 16, 64, or 256 QAM the data state detector 176 monitors the I and Q memories 72 and 74 for the data states corresponding to the outside corners of the IQ pattern or some other set of IQ modulation states that have a particular scalar magnitude. In a step 605 the trigger signal is used to key the IQ correction code 146 to receive the rotation angle θ and the magnitude 45. The steps 604 and 605 are repeated until the magnitude 45 has been received for several of the rotation angles θ. In a step 606, the rotation angle θ corresponding to each modulation state 56–59 detection is adjusted by an angle corresponding to that modulation state 56–59 for providing an adjusted calibration rotation angle Φ. For example, for the modulation state (1,1) 56 the adjusted rotation angle Φ is the rotation angle θ plus 0°; for the modulation state (1,0,) 57 the adjusted rotation angle Φ is the rotation angle θ plus 90° (π/2 radians); for the modulation state (0,0) 58 the adjusted rotation angle Φ is the rotation angle θ plus 180° (π radians); and for the modulation state (0,1) 59 the adjusted rotation angle Φ is the rotation angle θ plus 270° (3π/2 radians). The phase repeats with a modulo 2π. For example, a rotation angle θ of π plus a modulation state angle of 3π/2 equals an adjusted rotation angle Φ of π/2. When only one of the modulation states 56–59 is used it is not necessary to make this adjustment. Preferably, outliers in the function 210 (FIG. 9) are discarded.

The magnitudes 45 at a particular one of the adjusted rotation angles Φ is averaged and then the averaged magnitudes are organized according to adjusted rotation angle Φ as depicted in scalar amplitude 210. In a step 616 the IQ correction code 146 uses the function of the scalar amplitude 210 with respect to adjusted rotation angle Φ for computing adjustment information for the I and Q offset adjustments, the IQ phase adjustment, and the I/Q gain adjustment.

An algorithm for computing the adjustment information uses the amplitude and phase of the function of the scalar amplitude 210 versus adjusted rotation angle Φ at the fundamental rotation frequency of the calibration rotation angle θ for estimating the I and Q offset adjustments; and the amplitude and phase of the function of the scalar amplitude 210 versus adjusted rotation angle Φ at the second harmonic of rotation frequency for estimating the IQ phase adjustment and the IQ gain adjustment. The I offset adjustment for correcting the I offset 204 (FIG. 8B) and Q offset adjustment for correcting the Q offset 205 (FIG. 8B) are estimated from the adjusted rotation angle Φ for the maximum amplitude and variation in amplitude of the function 210 at the fundamental rotation frequency. The IQ phase adjustment and IQ gain adjustment are estimated for reducing the amplitudes at the major ellipses 206 (FIG. 8C) and 207 (FIG. 8D) from the adjusted rotation angles Φ of the maximum amplitude and variation in amplitude of the function 210 at the second harmonic of the rotation frequency. For results with the fewest iterations, the scalar amplitude detector 44 should be linear as described above. However, in a preferred embodiment where the method operates continuously, a non-linear scalar amplitude detector 44 can be used.

In a step 624, the adjustment information is used for calibrating for carrier leakage, calibrating I/Q phase (quadrature) error between the I modulation component and the Q modulation component, and calibrating for the ratio of the amplitudes between the I modulation component and the Q modulation component at the same time. The measurements, calculation of the adjustment information, and calibrations repeat continuously in order to reduce levels of the errors and to maintain their levels at minimum levels while the modulation system 10 in on-line.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A modulation system for providing a modulated output signal in response to an input data bit stream, comprising:
   a scalar amplitude detector for detecting magnitudes of said modulated output signal;
   an on-line correction data state detector for monitoring data states representative of said data bit stream and detecting when particular ones of said data states occur; and
   a correction code coupled to the data state detector for comparing particular ones of said detected magnitudes to one another when said modulated output signal corresponds to said particular data states and issuing adjustment information based upon said comparisons for calibrating said modulated output signal.

2. The modulation system of claim 1, wherein:
   said data bit stream includes an in-phase (I) data component and a quadrature phase (Q) data component; and further comprising:
   an IQ rotator for rotating I and Q digital data streams representative of said I and Q data components, respectively, by rotation angles for providing a rotated I digital data stream and a rotated Q digital data stream, said modulated output signal having an I modulation component responsive to said rotated I digital data stream and a Q modulation component responsive to said rotated Q digital data stream.

3. The modulation system of claim 2, wherein:
   the correction code determines variation of said detected magnitudes resulting from change of said rotation angles to another of said rotation angles and determines said adjustment information from said variation.

4. The modulation system of claim 3, wherein:
   the correction code uses said adjustment information for minimizing said variation of said detected magnitudes.

5. The modulation system of claim 2, wherein:
   the correction code computes a function for said detected magnitudes with respect to said rotation angles and determines said adjustment information from said function.

6. The modulation system of claim 2, wherein:
   the correction code computes output angles from said rotation angles and information indicative of which one of said particular data states is detected, computes a function for said detected magnitudes with respect to said computed output angles, and determines said adjustment information from said function.

7. The modulation system of claim 1, wherein:
   said modulated output signal includes IQ modulation states having in-phase (I) and quadrature phase (Q) modulation components and particular transition locations between said IQ modulation states in response to said particular data states; and
   said particular transition locations correspond to said particular detected magnitudes.

8. The modulation system of claim 7, wherein:
   said particular transition locations include a location on a transition path expected to pass near to a zero magnitude signal point for said modulated output signal.

9. The modulated system of claim 7, wherein:
   said particular transition locations include a location on a transition path between two of said IQ modulation states where one of said I and Q modulation components is about the same for each of said two IQ modulation states.

10. The modulation system of claim 1, wherein:
    said adjustment information includes an offset adjustment for reducing carrier leakage in said modulated output signal.

11. The modulation system of claim 1, wherein:
    said adjustment information includes an I/Q phase adjustment for reducing quadrature error in said modulated output signal.

12. The modulation system of claim 1, wherein:
    said adjustment information includes an I/Q gain adjustment for reducing an I/Q amplitude ratio error in said modulated output signal.

13. A method for providing a modulated output signal in response to an input data bit stream, comprising steps of:
    detecting magnitudes of said modulated output signal;
    monitoring data states representative of said data bit stream;
    detecting when particular ones of said data states occur;
    comparing particular ones of said detected magnitudes to one another when said modulated output signal corresponds to said particular data states; and
    computing adjustment information based upon said comparisons for calibrating said modulated output signal.

14. The method of claim 13, wherein:
    said data bit stream includes an in-phase (I) data component and a quadrature phase (Q) data component; and further comprising:
    rotating I and Q digital data streams representative of said I and Q data components, respectively, by rotation angles for providing a rotated I digital data stream and a rotated Q digital data stream, said modulated output signal having an I modulation component responsive to said rotated I digital data stream and a Q modulation component responsive to said Q digital data stream.

15. The method of claim 14, wherein:

the step of computing said adjustment information includes determining variation of said detected magnitudes resulting from change of said rotation angles to another of said rotation angles; and determining said adjustment information from said variation.

16. The method of claim 15, wherein:

the step of computing said adjustment information includes using said adjustment information for minimizing said variation of said detected magnitudes.

17. The method of claims 14, wherein:

the step of computing said adjustment information includes computing a function for said detected magnitudes with respect to said rotation angles; and determining said adjustment information from said function.

18. The method of claims 14, wherein:

the step of computing said adjustment information includes computing output angles from said rotation angles and information indicative of which one of said particular data states is detected;

computing a function for said detected magnitudes with respect to said computed output angles; and determining said adjustment information from said function.

19. The method of claim 13, wherein:

said modulated output signal includes IQ modulation states having in-phase (I) and quadrature phase (Q) modulation components and particular transition locations between said IQ modulation states in response to said particular data states; and said particular transition locations correspond to said particular detected magnitudes.

20. The method of claim 19, wherein: said particular transition locations include a location on a transition path expected to pass near to a zero magnitude signal point for said modulated output signal.

21. The method of claim 19, wherein:

said particular transition locations include a location on a transition path between two of said IQ modulation states where one of said I and Q modulation components is about the same for each of said two IQ modulation states.

22. The method of claim 13, wherein:

said adjustment information includes an offset adjustment; and further comprising a step of:

using said offset adjustment for reducing carrier leakage in said modulated output signal.

23. The method of claim 13, wherein:

said adjustment information includes an I/Q phase adjustment; and further comprising a step of:

using said I/Q phase adjustment for reducing quadrature error in said modulated output signal.

24. The method of claim 13, wherein:

said adjustment information includes an I/Q gain adjustment; and further comprising a step of:

using said 1/Q gain adjustment for reducing an I/Q amplitude ratio error in said modulated output signal.

\* \* \* \* \*